United States Patent
Bowler

[19]

[11] Patent Number: 6,141,365
[45] Date of Patent: Oct. 31, 2000

[54] SEMICONDUCTOR LASER WITH KINK SUPPRESSION LAYER

[75] Inventor: Dennis P. Bowler, Sudbury, Mass.

[73] Assignee: Lasertron, Bedford, Mass.

[21] Appl. No.: 09/002,151

[22] Filed: Dec. 31, 1997

[51] Int. Cl.[7] .................................................. H01S 3/085
[52] U.S. Cl. .............................................. 372/46; 372/45
[58] Field of Search ........................................ 372/45, 46

[56] References Cited

U.S. PATENT DOCUMENTS

| | | | |
|---|---|---|---|
| 4,367,916 | 1/1983 | Mottier et al. | 350/96.12 |
| 4,581,742 | 4/1986 | Botez | 372/45 |
| 4,689,797 | 8/1987 | Olshansky | 372/45 |
| 4,712,821 | 12/1987 | Bradford et al. | 372/44 |
| 4,744,089 | 5/1988 | Montroll et al. | 372/50 |
| 4,815,084 | 3/1989 | Scifres et al. | 372/45 |
| 4,853,936 | 8/1989 | Matsui et al. | 372/45 |
| 4,935,936 | 6/1990 | Nelson et al. | 372/46 |
| 5,028,562 | 7/1991 | Shima | 437/90 |
| 5,029,175 | 7/1991 | Ohnaka et al. | 372/46 |
| 5,059,552 | 10/1991 | Harder et al. | 437/129 |
| 5,088,099 | 2/1992 | Chen et al. | 372/45 |
| 5,144,634 | 9/1992 | Gasser et al. | 372/49 |
| 5,301,202 | 4/1994 | Harder et al. | 372/46 |
| 5,305,340 | 4/1994 | Antreasyan et al. | 372/43 |
| 5,392,308 | 2/1995 | Welch et al. | 372/92 |
| 5,454,004 | 9/1995 | Leger | 372/99 |
| 5,513,196 | 4/1996 | Bischel et al. | 372/22 |
| 5,523,256 | 6/1996 | Adachi et al. | 437/129 |
| 5,592,503 | 1/1997 | Welch et al. | 372/50 |
| 5,602,864 | 2/1997 | Welch et al. | 372/50 |
| 5,629,954 | 5/1997 | Jansen et al. | 372/43 |
| 5,859,866 | 1/1999 | Forrest et al. | 372/50 |

FOREIGN PATENT DOCUMENTS 07240560  9/1995  European Pat. Off. .......... H01S 3/18

OTHER PUBLICATIONS

Schemmann, M.F.C. et al., "Kink power in weakly index guided semiconductor lasers," Appl. Phys. Lett. 66(8), Feb. 20, 1995, pp. 920–922.

Man'ko, M.A., "Modes in Light Wave Propagating in Semiconductor Laser," N95–13925 Lebedev Physics Institute, Leninsky pr., 53, Moscow, 117333 Russia, pp. 219–225. (No Date).

Marsh, J.H. et al., "Edge emitting laser arrays with a well controlled transverse mode structure,"SPIE vol. 2398, pp. 94–105.

Chen, Y.K., "High–Power 980–nm AlGaAs/InGaAs Strained Quantum–Well Lasers Grown by OMVPE," *IEEE Photonics Technology Letters 3*, No. 5 (May 1991).

*Primary Examiner*—James W. Davie
*Attorney, Agent, or Firm*—Hamilton, Brook, Smith & Reynolds, PC

[57] ABSTRACT

A kink suppression technique is disclosed in which optical characteristics of a distributed feedback laser diode's resonant cavity are controlled to preferentially prevent establishment of higher order lateral modes. This results in increased kink powers and thus the useful power range of the device. Specifically, an optical layer, preferably silicon or titanium, is disposed along the optical axis, on the etched upper cladding layer, and on both sides of the ridge.

14 Claims, 7 Drawing Sheets

SEMICONDUCTOR LASER WITH KINK SUPPRESSION LAYER

BACKGROUND OF THE INVENTION

Semiconductor laser devices such as ridge waveguide lasers and laser amplifiers are used in many communications systems. Incremental refinements in their fabrication and packaging have resulted in a class of devices that have acceptable performance characteristics and a well-understood long-term behavior. Moreover, the ridge waveguide structures are less complex to fabricate and provide excellent yields as compared to more complex architectures based on buried heterostructures, for example.

In most applications, maximizing the laser's or amplifier's useful operating power is a primary design criteria. In long distance communication applications, the power output from the device dictates the distance to the next repeater stage, and the number of stages in a given link is a major cost factor in the link's initial cost and subsequent maintenance.

The useful operating power of laser devices is limited in many applications by a "kink" in the power versus current dependence above the lasing threshold, and weakly-guided semiconductor devices, such as ridge waveguide lasers, are particularly susceptible to these kinks. Kink definitions vary greatly but typically correspond to deviations of approximately 20% from a linear dependence above the threshold.

A number of different theories have been proposed to explain the kink in the power vs. current dependence. The theories agree insofar as there appears to be a shift of the eigenmode space at the higher currents that affects the total optical output and/or how the output is coupled into a fiber transmission media.

Notwithstanding the theoretical uncertainty, experimentation has demonstrated that the kink power for a given laser device is strongly dependent on its resonant cavity characteristics, e.g., cavity dimensions and refractive indices and their profile. For example, in the case of a weakly-guided gallium arsenide ridge waveguide devices, the characteristics of the resonant cavity are dictated in part by cladding layer parameters. Unfortunately, these cladding layer parameters and the fabrication processes used to define the parameters are difficult to control with the accuracy required for a single resonator design to be optimum for all wafers and all devices.

To compensate for parameters that can not be controlled with high accuracy, fabrication of ridge waveguide devices must be optimized for each base wafer to achieve acceptable kink power performance. Variations in the wafers are measured, and the acquired information is used to individualize the wafer's processing.

SUMMARY OF THE INVENTION

The wafer-to-wafer fabrication optimization is costly, and yields are decreased since many times portions of the wafers are sacrificed for testing. Moreover, tolerances required in the fabrication are generally beyond the capability of standard processes. Thus, even when the optimization is performed properly, kink power performance will still be unacceptable and widely distributed for many of the wafer's devices, reducing the yields even more.

According to the present invention, the conventional architecture of the ridge waveguide semiconductor is modified to dramatically reduce the dependency of kink power on the resonant cavity characteristics generally, and the ridge geometry specifically. This is accomplished by the addition of an optical layer of material adjacent or near to the ridge, which functions to suppress kinks in the power versus current dependence. Specifically, the inclusion of this optical layer has been demonstrated to increase average kink power by 80 mW, reduce kink power variation by 50%, and reduce by 40% the lateral far field divergence angle.

The kink suppressing optical layer controls the lasing modes and optimizes kink powers through a combination of absorption and modification of the effective index experienced by the desired fundamental and undesired higher order lateral resonator modes. And, while relative importance of these potential contributors is difficult to qualify, the absorption is believed to dominate. In addition, changes in stress, thermal conductivity, and waveguide geometry may also beneficially contribute to the performance of the present invention.

Some researchers have theorized that kinks in weakly guided ridge laser devices are a result of phase locking of the fundamental and a higher order mode. This results in a new eigenmode that is a combination of the two modes. The phase locking occurs when the propagation constants for the two modes become degenerate due to thermal or other perturbations that correlate with drive current. It is possible that the present invention inhibits this phase locking by modifying the propagation constants of the fundamental and higher order modes. Thus, significant absorption may not be required in the optical layer to achieve the observed results in some cases.

In general, according to one aspect, the invention features a semiconductor laser device. It comprises a semiconductor substrate having, preferably epitaxial, layers that include an active layer sandwiched by upper and lower cladding layers. Facets are located on opposite ends of the device along an optical axis, and a ridge is formed in the upper cladding layer, in a direction of the optical axis. The kink suppression layer is disposed along the optical axis and oriented relative to the cladding layers to reduce kink power dependence on resonant cavity characteristics.

In specific embodiments, the kink suppression layer is laterally truncated along a periphery of an optical mode region, and preferably comprises two sections, one on either side of the ridge.

Candidate materials for the kink suppression layer are evaluated on the basis of: 1) complex refractive index at the lasing wavelength, 2) possibility of adverse reliability impact, and 3) ease of deposition. In the preferred embodiment, the kink suppression layer comprises silicon. Silicon has a refractive index of 3.65) and absorption coefficient of 100 $cm^{-1}$. This compares with refractive indices of the silicon nitride passivation layer, upper cladding layer, and transverse mode, which are 2.0, 3.38, and 3.39, respectively. Thus, silicon has a reasonable index match for the preferred structure and desired absorption. Additionally, it has been used as an n-type dopant and facet coating material for a variety of lasers. Therefore, reliability concerns are minimized. Titanium is another excellent candidate given its 3.35 index of refraction, 500,000 $cm^{-1}$ loss, and ubiquitous use as an adhesion layer for metal films that are used to form contacts and high reflectance facet coatings. Other possible materials include, but are not limited to, gallium and germanium.

According to another aspect, the invention also features a method for making a semiconductor laser device. The method comprises forming a series of typically epitaxial layers including a lower cladding layer, an active layer, and an upper cladding layer. A ridge in then formed in the upper cladding layer. The kink suppression layer is then oriented relative to the cladding and active layers to reduce kink power dependence on ridge dimensions or resonant cavity characteristics generally.

In the preferred embodiment, the ridge is formed by etching the upper cladding layer on either side of a photoresist strip that extends in a direction of the optical axis. The strip is then used as a protecting layer during deposition of the kink suppression layer.

A key advantage of the preferred process is that the kink suppression layer is deposited using simple, standard thin film deposition technologies such as electron-beam evaporation and sputtered deposition processes. More complicated structures have been fabricated using regrowth techniques such as MBE, MOCVD, and LPE after the wafer has been selectively etched, to control mode characteristics. Such overgrowth is difficult on AlGaAs structures particularly if the aluminum fraction in the epitaxial layers can exceed 10%, as in the preferred embodiment.

Moreover, the preferred process allows the use of a simple, but temperature sensitive (i.e., less than 150° C.), photoresist mask and does not require elevated temperatures, typically greater than 300° C., encountered in regrown processes. Moreover, it is a self-aligned contact process in the preferred embodiment since the masking photoresist for the kink suppression layer is the same photoresist that was used during the ridge etch.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
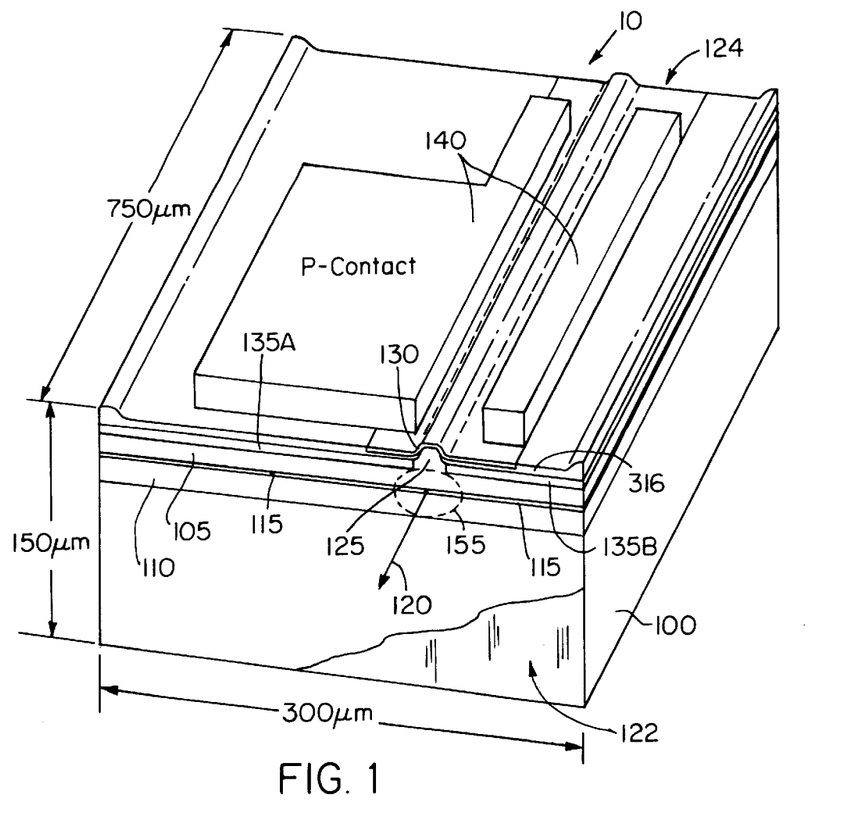
FIG. 1 is a perspective view showing the semiconductor laser device according to the present invention.

FIG. 1 is perspective view of a 980 nm semiconductor laser device 10, which has been constructed according to the principles of the present invention.

The device 10 is constructed on a substrate 100. In the preferred embodiment, it is gallium arsenide (GaAs). The substrate has upper and lower epitaxial cladding layers 105, 110 also preferably of GaAs but with varying amounts of aluminum, thus forming AlGaAs. These layers are graded p-type (105) and n-type (110) regions surrounding an active layer 115, which is preferably an undoped single quantum well (SQW) region of indium gallium arsenide (InGaAs).

In other embodiments, different material combinations are used. For example, an InP substrate with AlGaInAs epitaxial layers is an alternative implementation.

In any event, the resulting layered structure confines light generated in the active layer 115 primarily within a resonant cavity including the active and cladding layers. An antireflective front facet coating 122 and a highly reflective rear facet coating 124 establish the extent of the laser's resonant cavity along optical axis 120. Again, different coating combinations can be used including increasing the reflectivity of the front facet.

In the preferred embodiment, the semiconductor laser device is a ridge-type waveguide structure. A ridge 125 is formed, e.g., etched, in the upper cladding layer 105 in the direction of the optical axis 120. The regions surrounding the ridge are covered with a passivation layer 316, except for the ridge's top. Conductive layers 130 include a GaAs contact layer and metal electrode to form a good ohmic contact with the ridge top.

Located on either side of ridge 125 are two relatively large metal p-contact areas 140 that receive the electric leads and conduct electric current along the axis of the device and then down through the center of the ridge via the conductive layers 130. This ensures that current is injected through the ridge 125 into the active layer 115. Overall dimensions for the device in one implementation are approximately 300 $\mu$m wide, 150 $\mu$m high, and 750 $\mu$m long.

According to the invention, there is a kink suppression layer on the etched upper surface of the upper cladding layer 105, and thus under the passivation layer 316. Preferably, this kink suppression layer is an amorphous silicon layer that is formed in two sections or wings 135A, 135B on either side of the optical axis 120, below the top of ridge 125, and above the active layer 115. Each of these sections 135A, 135B extends longitudinally along the optical axis 120, preferably for the entire length of the resonant cavity. The sections are truncated in a lateral direction on either side of a plane that runs perpendicular to the active layer 115 and includes the optical axis 120. The sections end at a periphery of an optical mode region 155 in which over 95% of the fundamental's optical power propagates.

Figure 2:
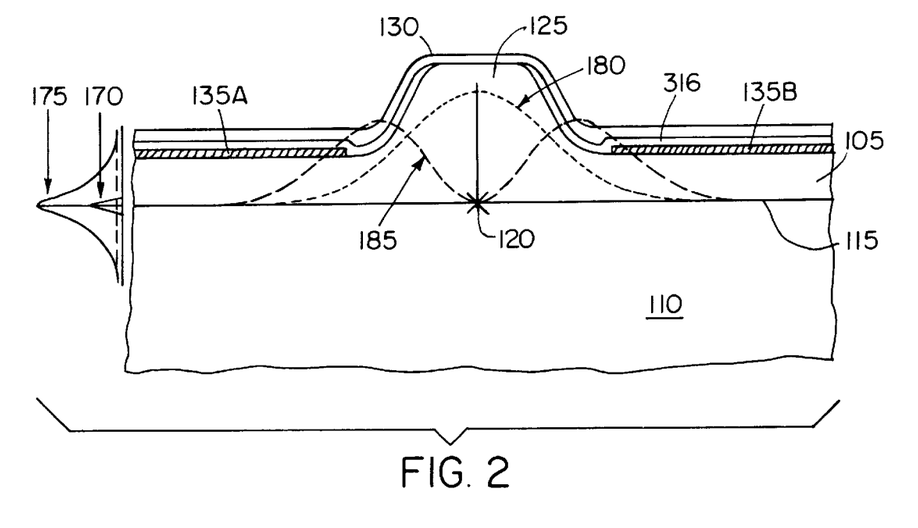
FIG. 2 is a cross-sectional view of the semiconductor laser device illustrating mode intensity distributions.

FIG. 2 is a cross-section of the ridge 125 and cladding layers 105, 110 taken orthogonally to the optical axis 120. As shown by the plots on the left hand side of FIG. 2, the linear graded index-separate confinement heterostructure-single quantum well (GRIN-SCH-SQW) index profile 170 exists in only a small band surrounding the active layer 115. The fundamental transverse mode intensity profile 175, however, is distributed across a much wider band, extending substantially into the ridge 125.

A plot 180 of the lateral fundamental mode intensity is superimposed on FIG. 2. The plot shows that. most of the mode's energy exists centered around the optical axis 120. In contrast, the next higher order lateral mode intensity, indicated by reference numeral 185, is at a null around the optical axis 120, but reaches maxima near the kink suppression layer 135A, 135B. Successive higher order lateral modes are increasingly broad, overlapping the kink suppression layer 135A, 135B to greater and greater degrees, thus experiencing increasingly higher optical effects.

It is theorized that the kink suppression layer affects kink power by adding optical losses to the higher order lateral or non-Hermite-Gaussian modes, thus preventing them from becoming established and resonating. This extends the eigenmode space to uniformly higher input currents.

When selecting the geometry of the kink suppression layer, the losses experienced by the desired fundamental mode should be minimized, while maximizing the losses experienced by higher order modes, particularly the next higher order mode. Acceptable losses for the fundamental mode are in the range of 0.01 to 1 times the loss experienced in the absence of the kink suppression layer with a preferred value of approximately 0.1 times the nominal loss.

In one embodiment, the lateral truncation and thickness of the kink suppression layer is controlled so that 1.5% of the fundamental transverse mode energy, 5.7% of the fundamental lateral mode energy, and 30.6% of the next higher order lateral mode overlap the suppression layer 135A, 135B. Thus, loss introduced by the layer is approximately 1/cm as compared to 20/cm loss that is typical for the resonator design on the absence of the kink suppression layer. The next higher lateral mode is expected to experience an additional loss of 6/cm due to the layer. These values were used in the design of the present implementation, but are subject to some uncertainties.

FIGS. 3–6 illustrate a process for forming a semiconductor laser device according to the principles of the present invention.

Figure 3:
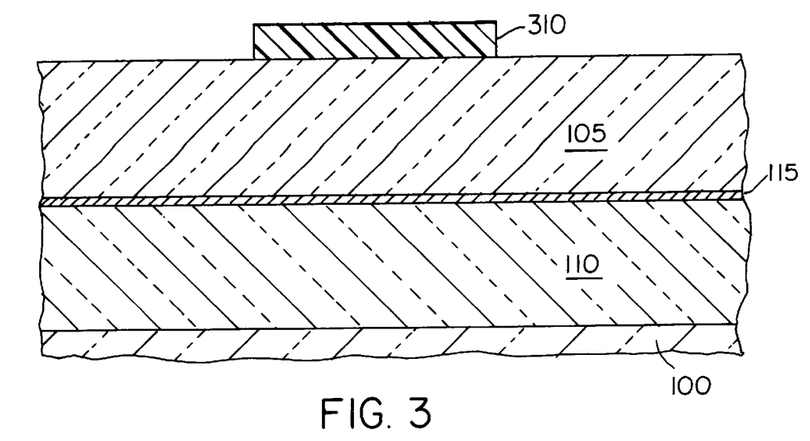
FIGS. 3–6 illustrate the process steps for fabricating a semiconductor laser device according to the present invention.

FIG. 3 is a cross-section of the partially completed laser device. The linearly graded index cladding layers 105, 110, formed on the substrate 100, sandwich the SQW active layer 115. In the preferred embodiment, the layers 105, 110 are successively formed using metal beam epitaxy (MBE), although other processes such as MOCVD and CBE may be used.

A photoresist strip 310 is then deposited on the upper cladding layer 105 over the region in which the ridge is to be formed. Methods for forming this photoresist layer 310 are well known. It typically comprises depositing a complete layer of photoresist over the entire top surface of the cladding layer followed by exposure and development.

Figure 4:
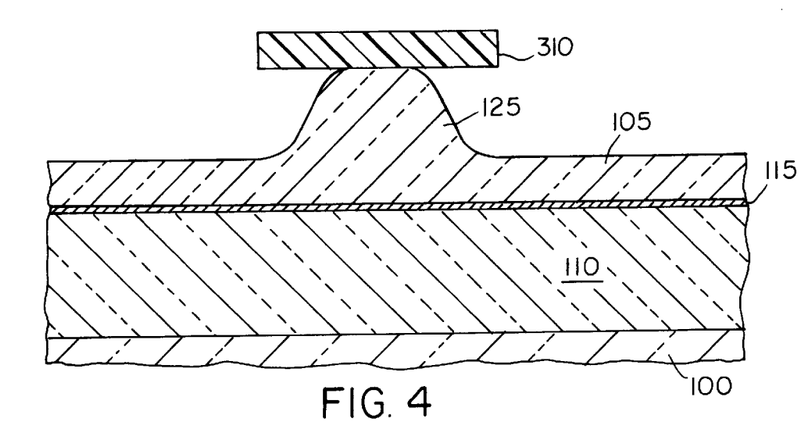

FIG. 4 shows the results of an etch of the upper cladding layer 105 using the photoresist layer 310 as an etch protecting layer. This process forms the ridge 125. The preferred embodiment employs a wet chemical etch. Etch solution chemistry and immersion times are used to control the ridge shape and size. In the test results discussed below, the wafer had a nominal residual cladding layer thickness of 4,200 Å, and a ridge height of 20,000 Å. The nominal ridge width was 5 µm.

Figure 5:
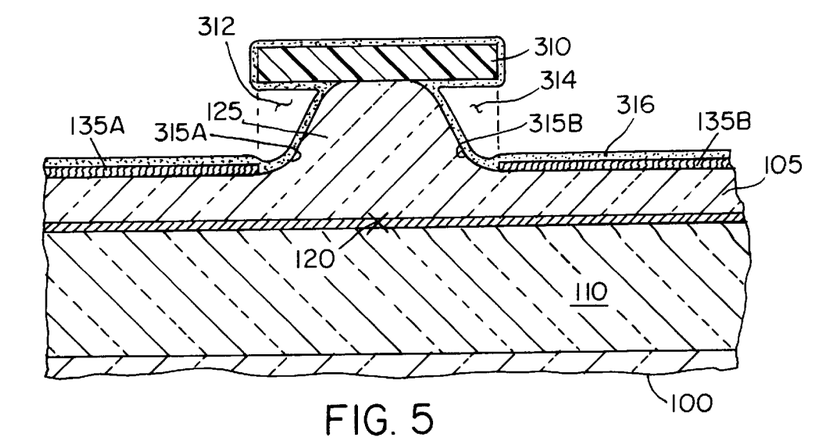

As shown in FIG. 5, in the next step, the right and left sections of the kink suppression layer 135A, 135B are deposited on either side of the ridge 125. Preferably, the deposition method used is highly directional so that the areas 312, 314 overhung by the photoresist 310 do not receive any of the kink suppression layer 135. Specifically, the kink suppression layer 135A, 135B is an amorphous silicon layer that is formed using electron-beam evaporation at normal incidence to the wafer.

The thickness of the silicon kink suppression layer 135A, 135B is a factor in performance. In the preferred embodiment, the silicon layer's thickness is 500–1000 Å. Specifically, it is 843 Å in the wafer tested and discussed below. Experiments have shown that silicon layer thicknesses of up to 1500 Å can be achieved, above which photoresist peeling occurs under the stress induced by the silicon layer. Other materials and/or masking techniques could extend this limit.

Of note is the use of a self-aligned mask 310. Generally, the relative alignment of the kink suppression layer to the optical mode region is critical and must be co-aligned to better than 1 µm.

In other embodiments, the silicon kink suppression layer is deposited along the lower side walls 315A, 315B of the ridge 125 to increase energy absorption. This effect is achieved by any one of a number of techniques such as: 1) rocking the substrate 100 during the silicon deposition process; 2) rotating the substrate 100 about its normal axis and depositing the silicon layer at an oblique angle relative to the rotational axis, or 3) using a non-directional deposition process such as sputtering. In still other embodiments, some of these techniques are used to deposit the silicon layer 135A, 135B asymmetrically about the optical axis 120.

In still other embodiments, the kink suppression layer is formed from a titanium, gallium, germanium, or other material layer that provides low diffusivity and high absorption at the operating wavelength of the device. The layer alternatively can be formed using ion implantation.

In the preferred embodiment, after the silicon layer has been laid down, a silicon nitride passivation layer 316 is deposited on the ridge 125, over the photoresist 310 and the silicon layer 135, using a non-directional deposition technique. The silicon nitride layer is 2,200 Å thick in the wafer results below. Alternatively, an air gap passivation layer could be substituted for higher frequency applications.

In one alternative process, a non-directional plasma enhanced chemical vapor deposition (PECVD) is used to deposit the silicon kink suppression layer 135A, 135B followed by the deposition of the silicon nitride passivation using PECVD with some minor process changes. The advantages of this process. are that: 1) the silicon and silicon nitride could be deposited using one piece of equipment and process sequence, which enhances the product's manufacturability; and 2) the silicon would extend up the side of the ridge.

Figure 6:
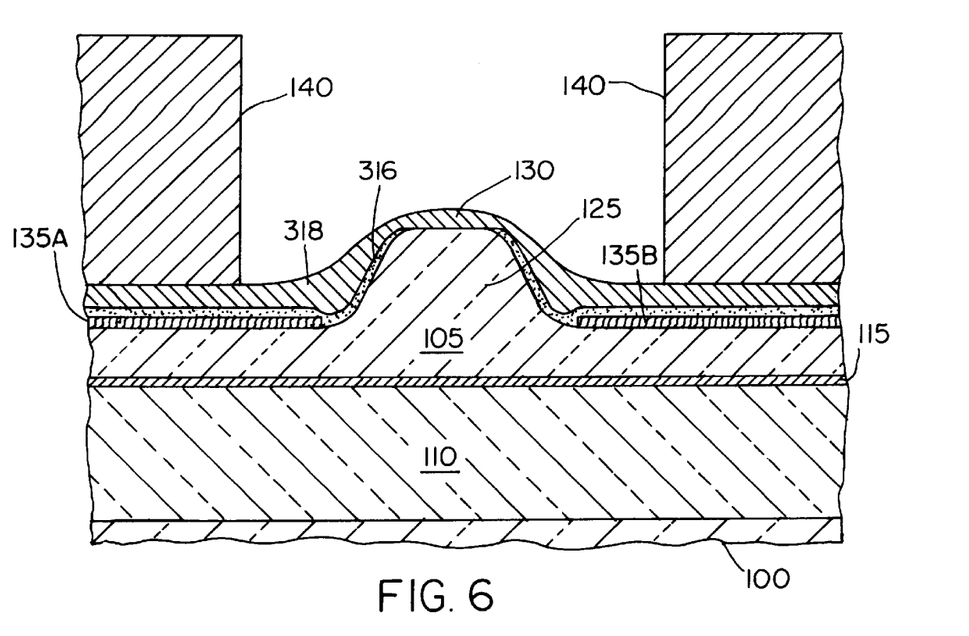

Finally, in FIG. 6, in the final step, the photoresist 310 is removed and a Ti/Pt/Au metalization layer 318 is deposited. In the result discussed below, a Ti/Pt/Au metalization overcoats have thicknesses of 200 Å/1500 Å/2000 Å, respectively. Additional gold is pleated 140 to provide ridge protection and wire bonding areas.

Figure 7:
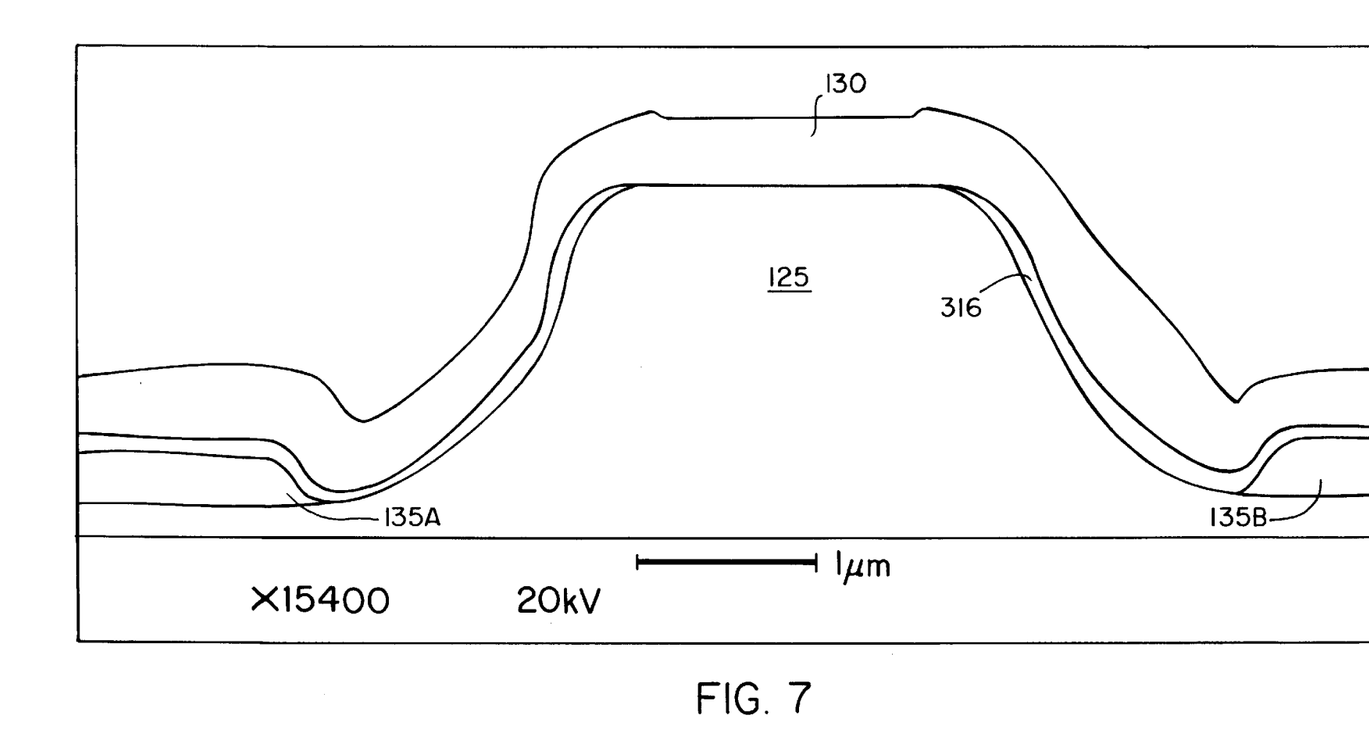
FIG. 7 is taken from an actual cross-secticonal image of the ridge in the inventive device.

FIG. 7 shows the actual ridge profile and layer thicknesses in one manufactured device from the wafer, the results of which are discussed below.

As is known in the art, many tens of ridges 125 are typically formed, side by side and parallel to each other along a single substrate/wafer 100. After the fabrication steps have been completed, the wafer is typically scribed and cleaved along planes that run perpendicular to the ridges along the length of the wafer. This yields what are termed "bars". Each of the bars is then scribed and cleaved between successive ridges to form individual semiconductor laser devices as shown in FIG. 1. As a result, many such devices can be formed from each bar and there are many bars in a single wafer.

In prior art processing techniques, ridge etch, illustrated here in FIG. 4, would be closely controlled to seek to obtain the best resonant cavity characteristics to maximize the kink powers of the resulting devices. This had to be performed on every wafer due to an inability to control cladding layer parameters with the necessary level of precision due to process limitations. And if ridge etch depth were not controlled, some other parameter affecting resonant cavity characteristics must be controlled to precise tolerances such as ridge width, cavity length, ridge profile, or refractive indices, for example. In contrast, as demonstrated by the following results, decoupling between the resonant cavity characteristics, e.g., ridge etch depth, is attained according to the invention.

Figure 8:
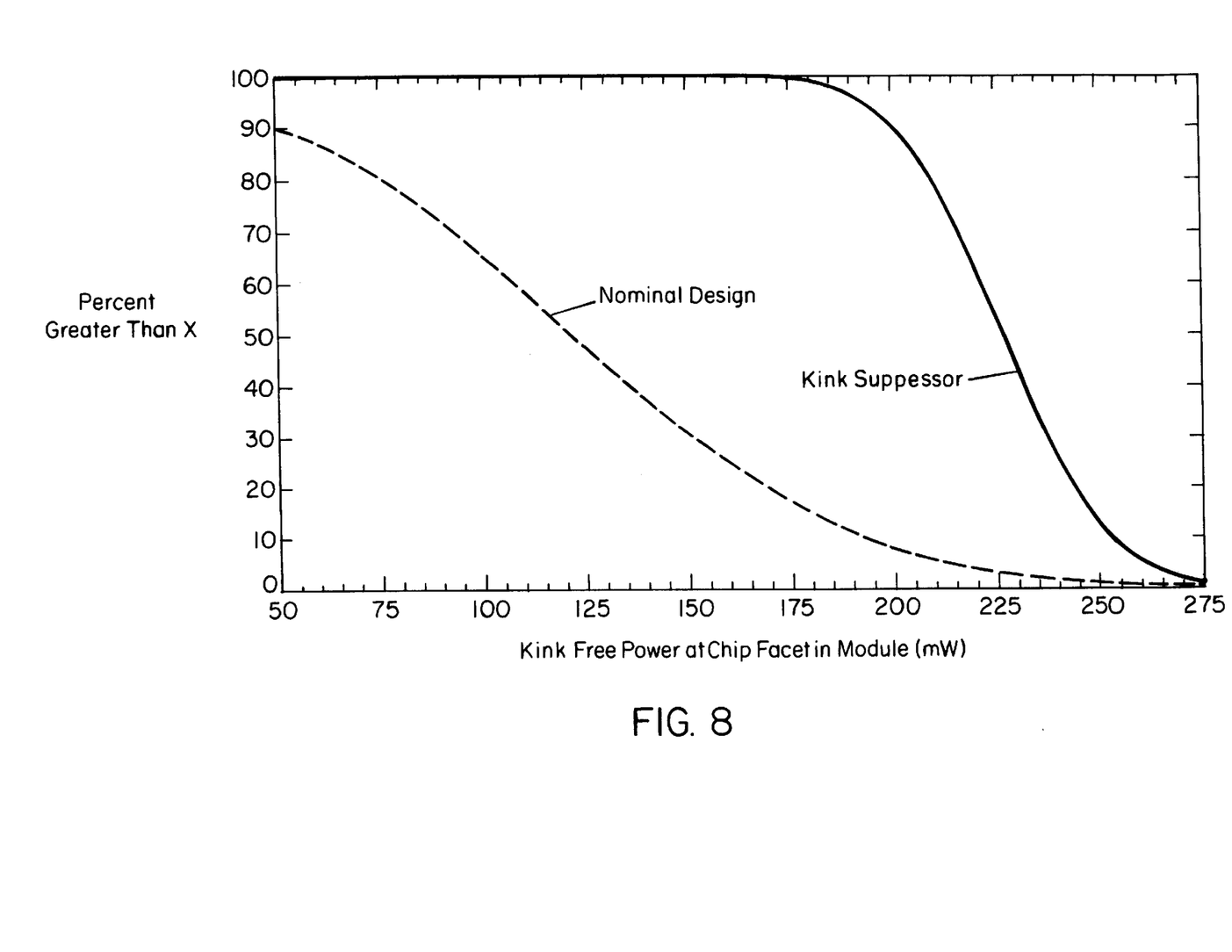
FIG. 8 is a plot of device yields relative to kink power for conventional devices (broken line) and devices with the inventive kink suppression layer (solid line)

FIG. 8 illustrates the advantages of the present invention from the standpoint of yields. Over 95% of the devices manufactured have kink powers greater than 190 milliwatts (mW); 50% of the devices have kink powers greater than 225 mW. These result compare to less than 50% of the conventionally-made devices, i.e., without the kink suppression layer, that have kink powers greater than 135 mW. Consequently, with the implementation of the present invention, kink powers of the inventive devices are uniformly higher that devices without the layer.

Standard deviation in the kink powers of devices from a given wafer is another metric for judging the advantages of the present invention. The standard deviation of kink powers in devices from the part of the wafer manufactured without the present invention was calculated to be 55.2. Devices from the part of the wafer manufactured using the silicon kink suppression layer resulted in a standard deviation of 20.8 in device kink powers. Thus, even though devices from the first and second wafer have substantially the same variability in resonant cavity characteristics from device-to-device, devices manufactured according to the present invention showed greatly improved kink power distribution.

Figure 9:
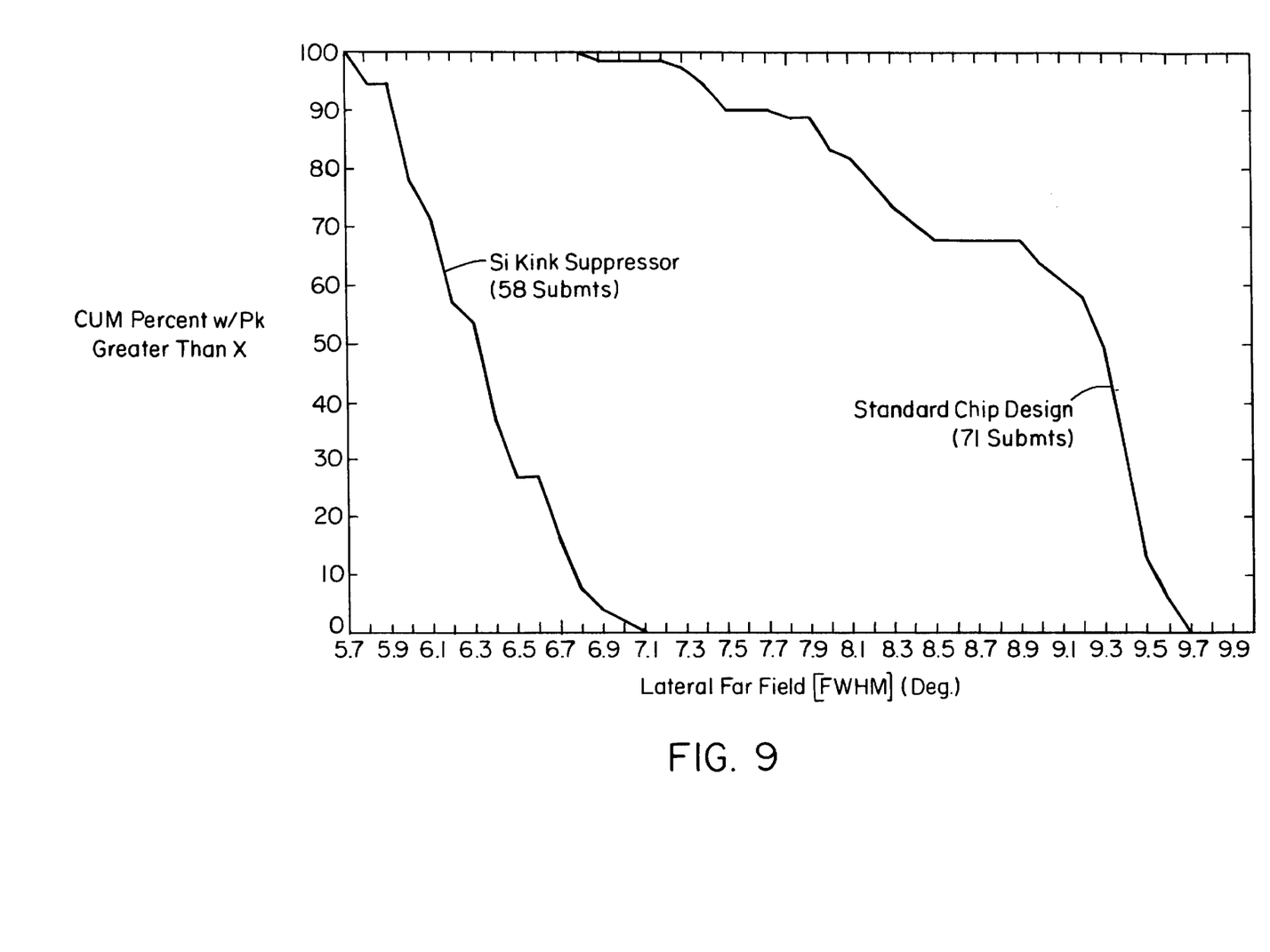
FIG. 9 is a plot of cumulative lateral far field distribution showing the percentage of devices having better than given lateral far field divergence angles for sub-mounted devices.

In addition to the improved kink powers and kink power distributions, the devices incorporating the invention have better lateral mode characteristics, as shown by FIG. 9. The present invention yields a 40% reduction in the lateral far field divergence angle from sub-mounted devices. Variations in lateral mode size are reduced by more than a factor of two and have an average value that is optimum for coupling to optical fibers used for telecommunications.

One potential drawback associated with the introduction of the silicon kink suppression layer is an expected increase in threshold current. In the tested devices, threshold currents increased 4 mA. Also, a decrease of 0.75% has been observed in the slope efficiency.

Figure 10:
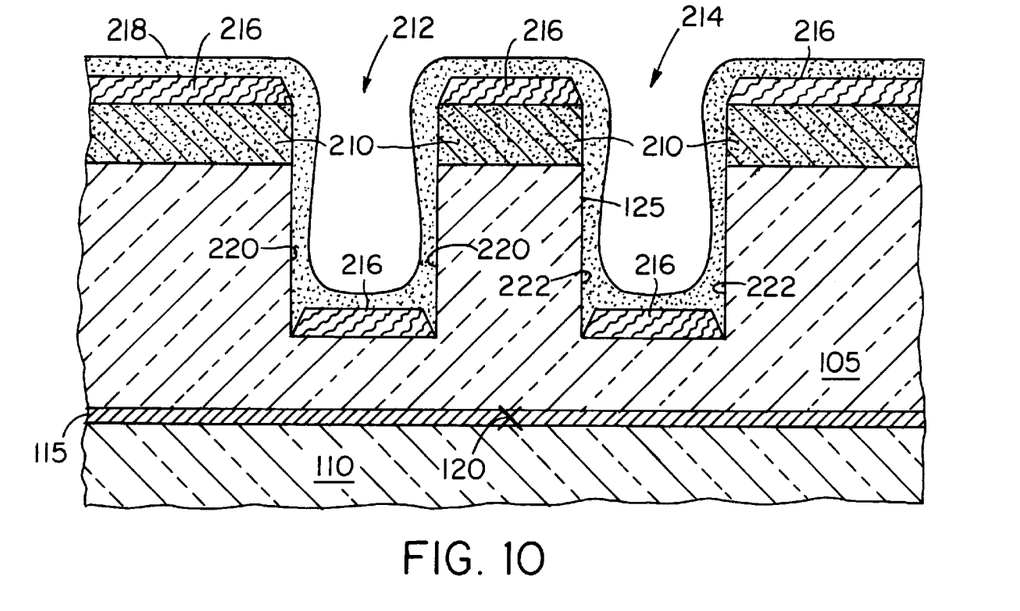
FIGS. 10 and 11 illustrate the process steps for fabricating the inventive semiconductor laser device according to another embodiment of the invention.
Figure 11:
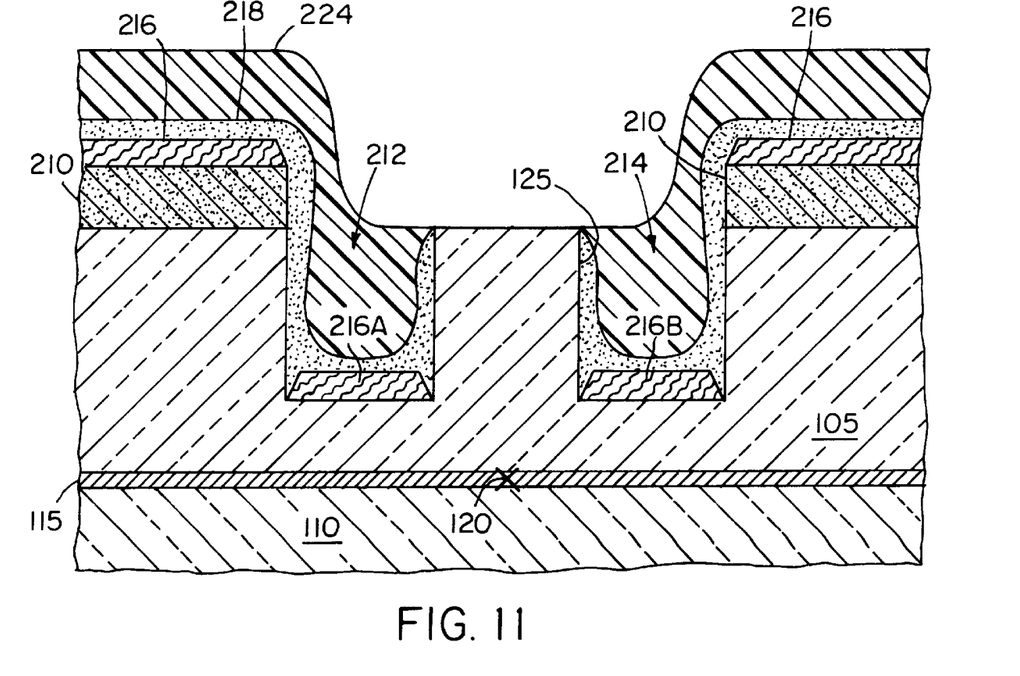

FIGS. 10 and 11 illustrate the application of the present invention to a different ridge architecture, commonly used in 1.3 and 1.5 micrometer devices. A As shown in FIG. 10, beginning with an InP substrate, lower cladding layer 110, upper cladding layer 105, and active layer 120 are epitaxially grown using AlGaInAs in varying elemental compositions. Photolithography processes are used to etch two channels 212,214 in the upper cladding layer 105 and an oxide layer 210 to a GaInAsP etch stop layer (not shown).

The kink suppression optical layer 216 is then deposited using a highly directional process so that little of the material appears on the sidewalls 220 and 222 of the wells 212 and 214. An insulating oxide passivation layer 218 is then coated over the entire substrate.

For 1.3 $\mu$m and 1.5 $\mu$m wavelength devices the kink suppression layer 216 is a suitable optical material, preferably one that is absorbing at these wavelengths, such as Ti.

Alternatively, the kink suppression layer 216 could be deposited using a less directional process so that the material 216 appears on the sidewalls 220 and 222 of the wells 212 and 214.

Of note is the fact that, as in the previous embodiment, the optical layer 216 is deposited between the epitaxial upper cladding layer 105 and a passivation layer, which is easily performed, alleviating somewhat the drawbacks associated with the implicit added process step.

FIG. 11 illustrates the next steps in the process in which a photoresist 224 is deposited over the substrate, exposed, and then partially developed in the region of the ridge 125. The partial development leaves a layer of the photoresist in the wells 212 and 214 but exposes the portions of the silicon oxide layer 218, silicon layer 216, and silicon oxide layer 210 on the ridge 125 so that they are removed in an etching process. This exposes the ridge 125 for subsequent electrical contact layers.

According to the invention, the silicon kink suppression layer 216A, 216B remains in the bottom of the wells 212 and 214 where it will improve the kink power performance of the resulting device.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A semiconductor laser device comprising:
    an active layer;
    upper and lower cladding layers sandwiching the active layer;
    a ridge, formed in the upper cladding layer, that extends in a direction of an optical axis;
    facets located on opposite ends of the device along the optical axis and defining a resonant cavity;
    a silicon layer disposed along the optical axis and oriented relative to the cladding layers to reduce kink power dependence on resonant cavity characteristics.

2. A semiconductor laser device as described in claim 1, wherein the silicon layer is formed on an etched portion of the epitaxial upper cladding layer.

3. A semiconductor laser device as described in claim 1, wherein the silicon layer increases the number of devices having kink powers greater than 150 mW to over 90%.

4. A semiconductor laser device as described in claim 1, wherein the silicon layer increases the number of devices having kink powers greater than 175 mW to approximately 90% or greater.

5. A semiconductor laser device as described in claim 1, wherein the silicon layer is laterally truncated along a periphery of an fundamental optical mode region.

6. A semiconductor laser device as described in claim 1, wherein the silicon layer comprises two sections that extend longitudinally down the optical axis under each side of the ridge.

7. A semiconductor laser device as described in claim 1, wherein the silicon layer is located between the top of the ridge and tie active layer.

8. A semiconductor laser device as described in claim 1, wherein the silicon layer is absorptive at an operating wavelength of the device and/or modifies an effective index of refraction experienced by higher order lateral modes.

9. A semiconductor laser device as described in claim 1, wherein the silicon layer is deposited on the upper cladding layer.

10. A semiconductor laser device as described in claim 9, wherein the silicon layer is deposited using evaporation/sputtering techniques.

11. A semiconductor laser device as described in claim 1, wherein the laser device is a laser amplifier.

12. A semiconductor laser device comprising:

an active layer;

epitaxial upper and lower cladding layers sandwiching the active layer;

facets located on opposite ends of the device along an optical axis;

a ridge, etched in the upper cladding layer, that extends in a direction of the optical axis;

a passivation layer deposited over the ridge; and an amorphous material layer disposed on either side of the ridge between the passivation layer and the etched upper cladding.

13. A semiconductor laser device as described in claim 12, wherein the amorphous material layer comprises silicon.

14. A semiconductor laser device as described in claim 12, wherein the amorphous material layer comprises titanium, gallium, or germanium.

* * * * *